(12) United States Patent
Patterson et al.

(10) Patent No.: US 6,237,129 B1
(45) Date of Patent: May 22, 2001

(54) METHOD FOR CONSTRAINING CIRCUIT ELEMENT POSITIONS IN STRUCTURED LAYOUTS

(75) Inventors: Cameron D. Patterson, Los Gatos; Eric F. Dellinger, San Jose; L. James Hwang, Menlo Park; Sujoy Mitra; Sundararajarao Mohan, both of Cupertino; Ralph D. Wittig, Menlo Park, all of CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 09/049,598

(22) Filed: Mar. 27, 1998

(51) Int. Cl.7 ............................. G06F 17/50; H03K 17/693
(52) U.S. Cl. .................................. 716/8; 716/10; 716/17
(58) Field of Search ...................................................... 716/8

(56) References Cited

U.S. PATENT DOCUMENTS

| | | |
|---|---|---|
| 4,554,625 | 11/1985 | Otten .................................... 364/148 |
| 4,918,614 | 4/1990 | Modarres et al. .................... 364/490 |
| 5,208,491 * | 5/1993 | Ebeling et al. ....................... 307/465 |
| 5,311,443 | 5/1994 | Crain et al. ........................... 364/491 |
| 5,351,197 | 9/1994 | Upton et al. .......................... 364/491 |
| 5,394,338 | 2/1995 | Shinohara et al. ................... 364/491 |
| 5,408,665 | 4/1995 | Fitzgerald . |
| 5,446,675 | 8/1995 | Yoshimura ............................ 364/489 |
| 5,491,640 | 2/1996 | Sharma et al. ....................... 364/488 |
| 5,499,192 | 3/1996 | Knapp et al. ......................... 364/489 |
| 5,519,627 | 5/1996 | Mahmood et al. ................... 364/488 |
| 5,519,630 | 5/1996 | Nishiyama et al. .................. 364/490 |
| 5,568,395 | 10/1996 | Huang .................................... 364/489 |
| 5,594,657 | 1/1997 | Cantone et al. ................. 395/500.17 |
| 5,602,754 | 2/1997 | Beatty et al. . |
| 5,612,893 | 3/1997 | Hao et al. ............................. 364/491 |
| 5,615,124 | 3/1997 | Hemmi et al. ....................... 364/488 |

(List continued on next page.)

FOREIGN PATENT DOCUMENTS 2306728   5/1997   (GB) .

OTHER PUBLICATIONS

K. Pocek et al., Optimizing FPGA–based Vector Product Designs, Symposium on Field–Programmable Custom Computing Machines, pp. 188–197, Apr. 1999.*

Bin–Da Liu et al., An Efficient Algorithm for Selecting Biparite Row or Column Folding of Programmable Logic Arrays, IEEE Transactions on Circuits and Systems, pp. 494–498, Jul. 1994.*

S.A. Guccione et al., A Data Parallel Programming Model for Reconfigurable Architectures, pp. 79–87, Apr. 1993.*

K. Pocek et al., JHDL–AN HDL for Reconfigurable Systems, FPGAs for Custom Computing Machines, pp. 175–184, Apr. 1998.*

B. Hutchings et al., A CAD Suite for High–Performance FPGA Design, IEEE Symposium on Field–Programmable Custom Computing Machines, pp. 12–24, Apr. 1999.*

(List continued on next page.)

*Primary Examiner*—Matthew Smith
*Assistant Examiner*—Annette M. Thompson
(74) *Attorney, Agent, or Firm*—Lois D. Cartier

(57) ABSTRACT

The invention supplies a method whereby placement information for elements of a logic module is specified in such a manner that specific coordinates need not be included. This method can be applied to any module or other element having an associated placement in a programmable device. Using the method of the invention, relative coordinates (such as the RLOC constraints discussed in relation to the prior art) need not be specified. Instead, the invention introduces a vector-based form of layout. Key words or phrases such as "COLUMN" or "ROW" indicate the manner in which the elements of the module are to be placed. Use of such parametric words or phrases removes from the module developer the burden of determining exactly how large the module will be for each parameter combination, and in some cases finding expressions by which the relative locations can be calculated.

35 Claims, 8 Drawing Sheets

U.S. PATENT DOCUMENTS

| | | |
|---|---|---|
| 5,636,125 | 6/1997 | Rostoker et al. . |
| 5,649,100 | 7/1997 | Ertel et al. ............................ 709/225 |
| 5,696,693 | 12/1997 | Aubel et al. .......................... 364/490 |
| 5,717,928 * | 2/1998 | Campmas et al. .................... 395/701 |
| 5,754,441 | 5/1998 | Tokunoh et al. ..................... 364/488 |
| 5,757,658 | 5/1998 | Rodman et al. ...................... 364/491 |
| 5,774,370 | 6/1998 | Giomi . |
| 5,818,728 * | 10/1998 | Yoeli et al. .......................... 364/491 |
| 5,828,588 | 10/1998 | Grant ................................... 364/718 |
| 5,838,165 * | 11/1998 | Chatter ................................... 326/38 |
| 5,838,583 | 11/1998 | Varadarajan et al. ................ 364/491 |
| 5,841,663 | 11/1998 | Sharma et al. ....................... 364/490 |
| 5,892,678 | 4/1999 | Tokunoh et al. ..................... 364/488 |
| 5,937,190 | 8/1999 | Gregory et al. ..................... 395/704 |
| 5,946,219 * | 8/1999 | Mason et al. ........................ 364/489 |
| 5,946,486 | 8/1999 | Pekowski . |
| 5,995,744 | 11/1999 | Guccione ........................ 395/500.44 |
| 6,023,742 * | 2/2000 | Ebeling et al. ....................... 710/707 |
| 6,026,228 | 2/2000 | Imai et al. . |
| 6,059,838 | 5/2000 | Fraley et al. . |
| 6,078,736 * | 6/2000 | Guccione ........................ 395/500.17 |
| 6,080,204 | 6/2000 | Mendel . |

OTHER PUBLICATIONS

S.C. Goldstein et al., PipeRench: A Reconfigurable Architecture and Compiler, pp. 70–77, Apr. 2000.*

K. Pocek et al., "Optimizing FPGA–based Vector Product Designs, Symposium on Field–Programmable Custom Computing Machiines", Apr., 1999, pp. 188–197.

Bin–Da Liu et al., "An Efficient Algorithm for Selecting Biparite Row or Column Folding of Programmable Logic Arrays", IEEE Transactions on Circuits and Systems, Jul., 1994, pp. 494–498.

S. A., Guccione et al., "A Data Parallel Programming Model for Reconfigurable Architectures", Apr., 1993, pp. 79–87.

K. Pocek et al., "JHDL–AN–HDL for Reconfigurable Systems, FPGA for Custom Computing Machines", Apr. 1998, pp. 175–184.

B. Hutchings et al., "A CAD Suite for High–Performance FPGA Design", IEEE Symposium on Field–Programmable Custom Computing Machines, Apr., 1999, pp. 12–24.

S. C. Goldstein et al., PipeRench: "A Reconfigurable Architecture and Compiler", Apr., 2000, pp. 70–77.

S. Tarafdar et al., "Integrating Floorplanning In Data–Transfer Based on High Level Synthesis", 1998 IEEE/ACM Conference on Computer–Aided Design, pp. 412–417.

K. Bazargan et al., Nostradamus: A Floorplanner of Uncertain Designs, IEEE Transactions on Computer–Aided Design of Integrated Circuits and Systems, 1999, pp. 389–397.

Mohanty et al., "SCUBA: An HDL Data–Path/Memory Module Generator for FPGAs," IEEE, pp. 135–142.

Andersson et al.,"Interaction Semantics of a Symbolic Layout Editor for Parameterized Modules," IEEE, pp. 1096–1106.

Kim et al., "An Analog Layout Floorplanner Using its Parameterized Module Layout Structure," IEEE, pp. 397–400.

Tsareff et al.,"An Expert System Approach to Parameterzied Module Synthesis," IEEE, pp. 28–36.

M. Evered et al., Genja—A New Proposal for Parameterised Types in Java, Technology of Object–Oriented Languages and Systems, Nov. 1997, pp. 181–193.

M. Odersky et al., Leftover Curry and reheated Pizza: How functional programming nourishes software reuse, Fifth International Conference on, Jun. 1998, pp. 2–11.

B. Djafri et al., OOVHDL: Object Oriented VHDL, VHDL International Users' Forum, Oct. 1997, pp. 54–59.

W. Wolf, How to Build a Hardware Description and Measurement System on an Object–Oriented Programming Language, IEEE Transactions on Computer–Aided Design, Mar. 1989, pp. 288–301.

P. Bellows et al., JHDL—An HDL for Reconfigurable Systems, IEEE Symposium on FPGAs for Custom Computing Machines, Apr. 1998, pp. 175–184.

D. W. Knapp et al., The ADAM Design Planning Engine, Computer–Aided Design of Integrated Circuits and Systems, Jul. 1991, pp. 829–846.

J. Granacki et al., The ADAM Advanced Design Automation System, ACM/IEEE Conference on Design Automation, Apr. 1985, pp. 727–730.

Wayne Wolf, An Object–Oriented, Procedural Database for VLSI Chip Planning, ACM/IEEE Conference on Design Automation, Apr. 1986, pp. 744–751.

Yamazaki, Takao et al., "A Top Down for Data Path Design", Sep. 1993, Proceedings of the Sixth Annual IEEE International ASIC Conference and Exhibit, pp. 266–269.

Evolution User's Guide [online] Morphologic., [retrieved on Sep. 1, 1999]. Retrieved from the Internet: http://www.morphologic.com.

Mencer, O. et al., PAM–Blox: High Performance FPGA Design for Adaptive Computing, FPGAs for Custom Computing Machines, Apr. 1998, proceedings, IEEE Symposium on., pp. 167–174.

Kelem., S. H., et al., Shortening the Design Cycle for Programmable Logic, IEEE Design & Test of Computers, Dec. 1992, pp. 40–50.

Usami, K. et al., Hierarchical Symbolic Design Methodology for Large–Scale Data Paths, IEEE Journal of Solid State Circuits, Mar. 1991, pp. 381–385.

Engel, R. et al., Making Design Patterns Explicit in FACE, Proceedings of the 6th European Conference, Sep. 1997, pp. 94–110.

N. Gefland, Teaching Data Structure Design Patterns, Proceedings of the 29th SIGCSE Technical Symposium, Feb. 1998, pp. 331–335.

Kortright, E.V., Modeling and Simulation with UML and Java, Simulation Symposium, Proceedings., 30th Annual, Apr. 1997, pp. 43–48.

Kelem, S. H. et al., Context–based ASIC Synthesis, Euro ASIC '92, Proceedings., pp. 226–231.

Brasen, D.R., MHERTZ: A New Optimization Algorithm for Floorplanning and Global Routing, Design Automation Conference, Jun. 1990, Proceedings., 27th ACM/IEEE.

Smith, William D. et al., Flexible Module Generation in the FACE Design Environment, IEEE International Conference on Computer–Aided Design, Nov. 1988, pp. 396–399.

Lechner E. et al: "The Java Environment for Reconfigurable Computing" Field–Programmable Logic and Applications. 7th International Workshop, FPL '97. Proceedings, London, UK, Sep. 1–3, 1997, pp. 284–293, XP002086682 ISBN 3–540–63465–7, 1997, Berlin, Germany, Springer–Verlag, Germany.

Pottier B. et al: "Revisiting Smalltalk–80 blocks: a logic generator for FPGAs", Proceedings. IEEE Symposium on FPGAs for Custom Computing Machines (Cat. No. 96TB100063), Napa Valley, CA, USA, Apr. 17–19, 1996, pp. 48–57, XP002103589 ISBN 0–8186–7548–9, 1996, Los Alamitos, CA, USA.

Swamy S. et al.: "00–VHDL Object–Oriented Extensions to VHDL", Computer vol. 28, No. 10, Oct. 1, 1995, pp. 18–26 XP000535917.

Dekker R. et al. "HDL Synthesis for FPGA Design" Electronic Engineering, vol. 66, No. 814, Oct. 1, 1994, p. S43/44, 46 XP000471392.

Maxfield C: "LPMS: High–Level Design Uses Low–Level Techniques" EDN Electrical Design News, vol. 41, No. 10, May 9, 1996, pp. 125–131, XP00597964.

Hwang J. et al.: "Generating Layouts for Self–Implementing Modules", Field–Programmable Logic and Applications. From FPGAs to Computing Paradigm. 8th International Workshop, FPL, Aug. 31, 1998, pp. 525–529, XP002103590, ISBN 3–540–64948–4, 1998, Berlin, Germany, Springer–Verlag, Germany.

"The Programmable Logic Data Book" copyright Sep. 1996, pp. 4–5 through 4–78, Xilinx, Inc., 2100 Logic Drive, San Jose, CA 95124.

"XC4000 Family Hard Macro Style Guide", published Sep. 3, 1991 and available from Xilinx, Inc., 2100 Logic Drive, San Jose, CA 95124.

"Xilinx Libraries Guide", published Oct. 1995, pp. 4–71 to 4–97, available from Xilinx, Inc., 2100 Logic Drive, San Jose, CA 95124.

"X–BLOX User Guide", published Apr., 1994, pp. 1–1 to 2–14 and 4–36 to 4–46, available from Xilinx, Inc., 2100 Logic Drive, San Jose, CA 95124.

"CORE Solutions Data Book", copyright 1997, pp. 4–3 to 4–4 and 2–3 to 2–91, available from Xilinx, Inc., 2100 Logic Drive, San Jose, CA 95124.

"Automated Layout of Integrated Circuits", pp. 113–195 of "Design Systems for VLSI Circuits", edited by G. De Micheli, A. Sangiovanni–Vincentelli, and P. Antognetti, published 1987, by Martinus Nijhoff Publishers.

* cited by examiner

METHOD FOR CONSTRAINING CIRCUIT ELEMENT POSITIONS IN STRUCTURED LAYOUTS

CROSS-REFERENCE TO RELATED APPLICATIONS

This application relates to the following concurrently filed, commonly assigned U.S. patent application:

Ser. No. 09/049,892 invented by L. James Hwang, Eric F. Dellinger, Sujoy Mitra, Sundararajarao Mohan, Cameron D. Patterson, and Ralph D. Wittig, entitled "HETEROGENEOUS METHOD FOR DETERMINING MODULE PLACEMENT IN FPGAS", which is incorporated herein by reference.

BACKGROUND OF THE INVENTION

1. Field of the Invention

The invention relates to Field Programmable Gate Arrays (FPGAs). More particularly, the invention relates to a method for constraining relative circuit element positions in structured FPGA layouts.

2. Description of the Background Art

Programmable ICs are a well-known type of digital integrated circuit that may be programmed by a user to perform specified logic functions. One type of programmable IC, the field programmable gate array (FPGA), typically includes an array of configurable logic blocks (CLBs) surrounded by a ring of programmable input/output blocks (IOBs). The CLBs and IOBs are interconnected by a programmable interconnect structure. The CLBs, IOBs, and interconnect structure are typically programmed by loading a stream of configuration data (bitstream) into internal configuration memory cells that define how the CLBS, IOBs, and interconnect structure are configured. The configuration data may be read from memory (e.g., an external PROM) or written into the FPGA by an external device. The collective states of the individual memory cells then determine the function of the FPGA.

One such FPGA, the Xilinx XC4000™ Series FPGA, is described in detail in pages 4–5 through 4–78 of the Xilinx 1996 Data Book entitled "The Programmable Logic Data Book" (hereinafter referred to as "the Xilinx Data Book"), published September, 1996, available from Xilinx, Inc., 2100 Logic Drive, San Jose, Calif. 95124, which pages are incorporated herein by reference. (Xilinx, Inc., owner of the copyright, has no objection to copying these and other pages referenced herein but otherwise reserves all copyright rights whatsoever.)

As FPGA designs increase in complexity, they reach a point at which the designer cannot deal with the entire design at the gate level. Where once a typical FPGA design comprised perhaps 5,000 gates, FPGA designs with 20,000 gates are now common, and FPGAs supporting over 100,000 gates will soon be available. To deal with this complexity, circuits are typically partitioned into smaller circuits that are more easily handled. Often, these smaller circuits are divided into yet smaller circuits, imposing on the design a multi-level hierarchy of logical blocks.

Libraries of predeveloped blocks of logic have been developed that can be included in an FPGA design. Such library modules include, for example, adders, multipliers, filters, and other arithmetic and DSP functions from which complex designs can be readily constructed. The use of predeveloped logic blocks permits faster design cycles, by eliminating the redesign of duplicated circuits. Further, such blocks are typically well tested, thereby making it easier to develop a reliable complex design.

To offer the best possible performance, some library modules have a fixed size and shape, with relative location restrictions on each element. One type of module having a fixed size and shape is the Relationally Placed Macro (RPM) from Xilinx, Inc. RPMs are described in pages 4–96 and 4–97 of the "Libraries Guide" (hereinafter referred to as the "Xilinx Libraries Guide"), published October 1995 and available from Xilinx, Inc., which pages are incorporated herein by reference. An RPM is a schematic that includes constraints defining the order and structure of the underlying circuits. The location of each element within the RPM is defined relative to other elements in the RPM, regardless of the eventual placement of the RPM in the overall design. For example, an RPM might contain 8 flip-flops constrained to be placed into four CLBs in a vertical column. The column of four CLBs can then be placed anywhere in the FPGA.

Relative CLB locations in an RPM are specified using a Relative Location Constraint called "RLOC". RLOC constraints are described in detail in pages 4–71 through 4–95 of the Xilinx Libraries Guide, which pages are incorporated herein by reference. Elements having an RLOC value of R0C0 are located in a given CLB corresponding to the (0,0) coordinate location. The next CLB "below" the (0,0) CLB is designated as R1C0, corresponding to the (0,1) coordinate location. When the FPGA design is mapped and placed (prior to the final routing step), these RLOC constraints are referenced and, in effect, make the RPM a "jigsaw puzzle piece" to be fitted into the FPGA along with other elements and/or modules. Although the RPM has a rigid size and shape, other logic can be placed within the borders of the RPM.

Although this coordinate-based method of specifying relative locations is a useful way to represent positions, modules including numerical coordinates can be difficult to maintain. When one element is added, moved, deleted, or resized, the coordinates of other elements (potentially all other elements in the module) can require modification. In addition, the coordinate values are affected by several other factors, such as the target FPGA architecture, the size of the target FPGA device, and the size of the module itself, which may in turn be affected by the results of the mapping phase of the map, place, and route process.

The CLB resources in different architectures may differ in both number and type. For example, the Xilinx XC4000 Series CLB includes two 4-input function generators, one 3-input function generator, and two flip-flops. The Xilinx XC3000™ Series CLB includes two 4-input function generators and two flip-flops. The Xilinx XC5200™ CLB includes four 4-input function generators and four flip-flops. Therefore, to re-target a module including numerically-specified relative coordinates from one of these architectures to another, considerable effort may be required.

Designs are typically entered either with schematic entry or Hardware Description Languages (HDLs). When schematic entry is used, explicit relative locations are typically given. When structural HDL code (e.g., structural VHDL) is used, the code can be parameterized and executed using the GENERATE statement. When the GENERATE statement is used, the assignment of RLOC coordinates to circuit elements in the VHDL code sometimes requires complicated arithmetic expressions, which can be a significant verification burden.

Although an RPM can be moved from place to place on an FPGA without modifying its relative coordinates, the processes of defining and modifying an RPM are subject to the limitations described above. It is therefore desirable to provide a method for constraining relative circuit element positions that does not use numerical coordinates. It is further desirable that the method be independent of the targeted FPGA architecture.

SUMMARY OF THE INVENTION

The invention supplies a method whereby placement information for elements of a logic module is specified in such a manner that specific coordinates need not be included. This method can be applied to any module or other element having an associated placement in a programmable device. Using the method of the invention, relative coordinates (such as the RLOC constraints discussed in relation to the prior art) need not be specified. Instead, the invention introduces a vector-based form of layout. Key words or phrases such as "COLUMN" or "ROW" indicate the manner in which the elements of the module are to be placed. Use of such parametric words or phrases removes from the module developer the burden of determining exactly how large the module will be for each parameter combination, and in some cases finding expressions by which the relative locations can be calculated.

BRIEF DESCRIPTION OF THE DRAWINGS

The present invention is illustrated by way of example, and not by way of limitation, in the following figures, in which like reference numerals refer to similar elements.

DETAILED DESCRIPTION OF THE DRAWINGS

Figure 1:
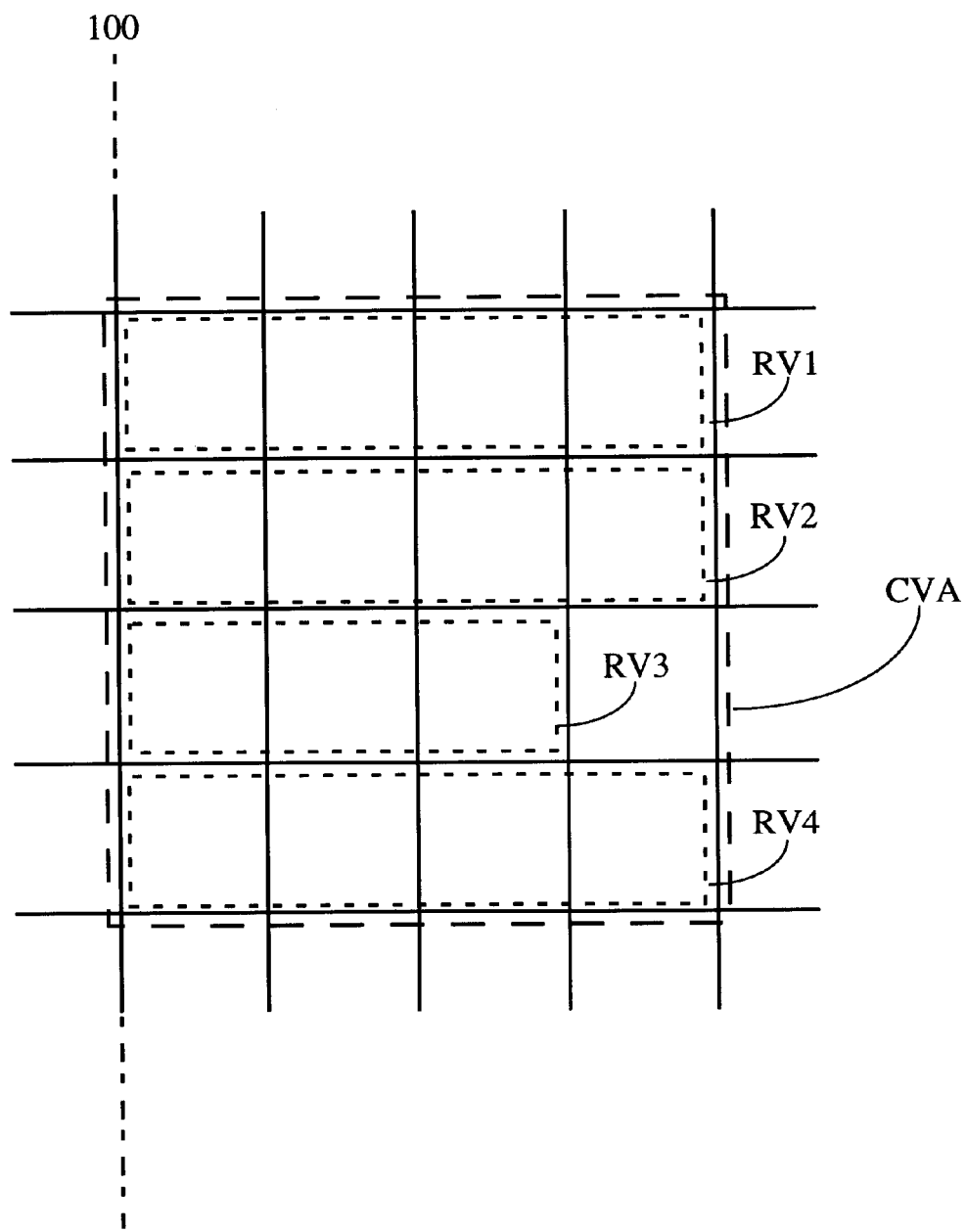
FIG. 1 shows a logic module having an assigned column orientation, top direction, and left alignment, mapped into a CLB array.

A vector-based method of specifying physical positions for elements within a logic module according to the invention is described. In the following description, numerous specific details are set forth to provide a more thorough understanding of the present invention. However, it will be apparent to one skilled in the art that the present invention may be practiced without these specific details.

Many logical structures used in FPGA designs are one-dimensional, or can be decomposed into one-dimensional structures. The vector-based (as opposed to coordinate-based) method of the invention supports this "slicing" floorplanning approach. A "slicing floorplan" is a floorplan that can be obtained by repeatedly partitioning a rectangle into two parts, either by a vertical line or a horizontal line. (Slicing floorplans are described by Sangiovanni-Vincentelli in "Automated Layout of Integrated Circuits", pp. 113–195 of "Design Systems for VLSI Circuits", edited by G. De Micheli, A. Sangiovanni-Vincentelli, and P. Antognetti, published in 1987 by Martinus Nijhoff Publishers, which pages are incorporated herein by reference.)

According to the method of the invention, a logic module is decomposed into a hierarchy of one-dimensional structures, or vectors. (A module that cannot be so decomposed is called a "primitive" module, and corresponds in one embodiment to a basic FGPA element such as a function generator or a flip-flop.) Each vector comprises zero or more sub-vector elements. Each vector forms an ordered collection of these elements, with indexed access. The vector is assigned an "orientation" attribute, in one embodiment either "row" or "column". In one VHDL embodiment, a vector with a column orientation (a "column vector") is created as follows:

vectorName_layout: vector_template GENERIC MAP (orientation=>column);

Another embodiment of the invention is implemented in a high-level object-oriented programming language called Java™. ("Java" is a trademark of Sun Microsystems, Inc.) In one Java embodiment, the column vector is created as follows:

VectorTemplate vectorNameLayout= vectorName.applyVectorTemplate(COLUMN);

A vector is also generally assigned a "direction" attribute. A vector with a row orientation (a "row vector") can have either a "left" or a "right" direction. A left direction means that the first sub-element is placed at the left edge of the row vector. A right direction means that the first sub-element is placed at the right edge of the row vector. Similarly, a column vector can have either a "top" or "bottom" assigned direction. In one VHDL embodiment, a top direction is assigned to an existing column vector as follows:

vectorName_layout: vector_template GENERIC MAP (col_direction=>from_top);

In one Java embodiment, the top direction is assigned as follows:

vectorNameLayout.colDirection(FROM_TOP);

In one embodiment, a default direction and other default attribute values are assumed unless a value is specified. For example, in one embodiment a column "bottom" direction is assumed by default.

An "alignment" attribute ("left" or "right" for column vectors, "bottom" or "top" for row vectors) can also be specified for one or all vector elements. In a column vector with a specified left alignment, for example, the elements making up the column vector are aligned at their left edges. In one VHDL embodiment, a left alignment is assigned to all elements of an existing column vector as a comment embedded in the VHDL code, as follows:

pragma vectorName_layout.alignAllElements(LEFT);

In one Java embodiment, the left alignment is assigned as follows:

vectorNameLayout.alignAllElements(LEFT);

FIG. 1 shows a vector having an assigned column orientation, left alignment, and top direction, as mapped into an FPGA CLB array. The four row vectors RV1–RV4 making up column vector CVA are aligned along their left edges (i.e., along line 100). The row vectors are in order from top to bottom, following the sequence in which they are encountered in the code describing column vector CVA.

Figure 2:
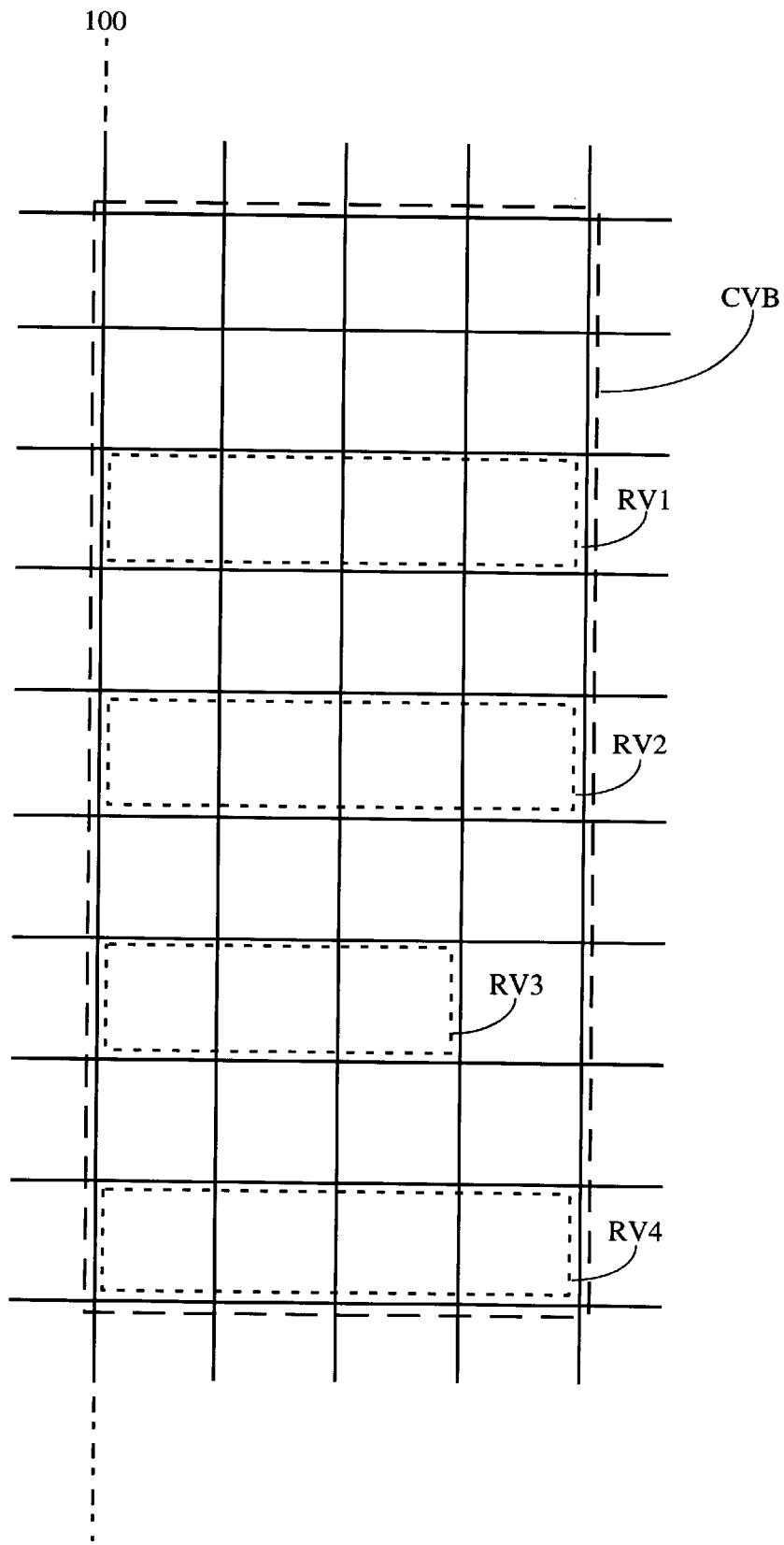
FIG. 2 shows a logic module similar to the module of FIG. 1, but having additional assigned stride and offset values, mapped into a CLB array.

In one embodiment, elements in a vector are abutted directly to one another. In another embodiment, the default placement is with elements directly abutting, but an optional "stride" attribute provides for spacing between elements, and an optional "offset" attribute reserves space before the first element. An offset value defines the number of unused tiles (e.g., CLBs) before the first element, while a stride value defines the minimum number of tiles between the starting points of any two adjacent elements. In one Java embodiment, a stride value of "2" is assigned to an existing row or column vector as follows:

vectorNameLayout.stride(2);

and an offset value of "2" is assigned to an existing row or column vector as follows:

vectorNameLayout.offset(2);

FIG. 2 shows a vector similar to the vector of FIG. 1, but having additional assigned stride and offset values, mapped into a CLB array. In vector CVB of FIG. 2, the stride value is set to "2", and the offset value is also set to "2". Proceeding from top to bottom as indicated by the specified direction ("top"), vector CVB first includes two empty rows of CLBs (offset=2), followed by row vectors RV1–RV4, with one empty row between each row vector (stride=2).

FIGS. 1 and 2 illustrate an advantage that the vector-based placement information of the invention has over coordinate-based implementations. Specifically, if the positions of RV1–RV4 in FIG. 1 were specified using coordinates, creating the vector of FIG. 2 would require the user to recalculate all of these coordinates. For large designs, this recalculation can involve a significant effort.

A module can specify that a vector be "folded" to fit into an available space. In one embodiment, folding is specified for an existing vector as follows:

vectorNameLayout.foldSize(expression);

The foldSize attribute specifies the number of elements after which a new row or column is started. In one embodiment, automatic folding is performed when a vector reaches a boundary of the target device. The direction in which a vector is to be folded can optionally be specified, as in the following example:

vectorNameLayout.colFold(RIGHT);

Vectors allow structured layouts to be described succinctly. For example, a two-dimensional array of circuit elements can be represented as a row vector, where each element of the row vector is a column vector. In general, any slicing floorplan can be obtained by the recursive application of vector-based layouts. Non-slicing floorplans are still achievable by defining an RPM including vector-based elements, where the vector-based elements have relative locations specified using traditional methods such as RLOC constraints.

It is also desirable to have the ability to merge vector elements across hierarchical boundaries. This ability increases the density of the resulting implementation. Sometimes the speed of the resulting implementation is increased as well, due to reduced interconnect delays. One embodiment of the invention provides three methods by which vector elements can be merged across hierarchical boundaries. These methods are referred to herein as "overlapping", "interleaving", and "remapping".

Figure 3:
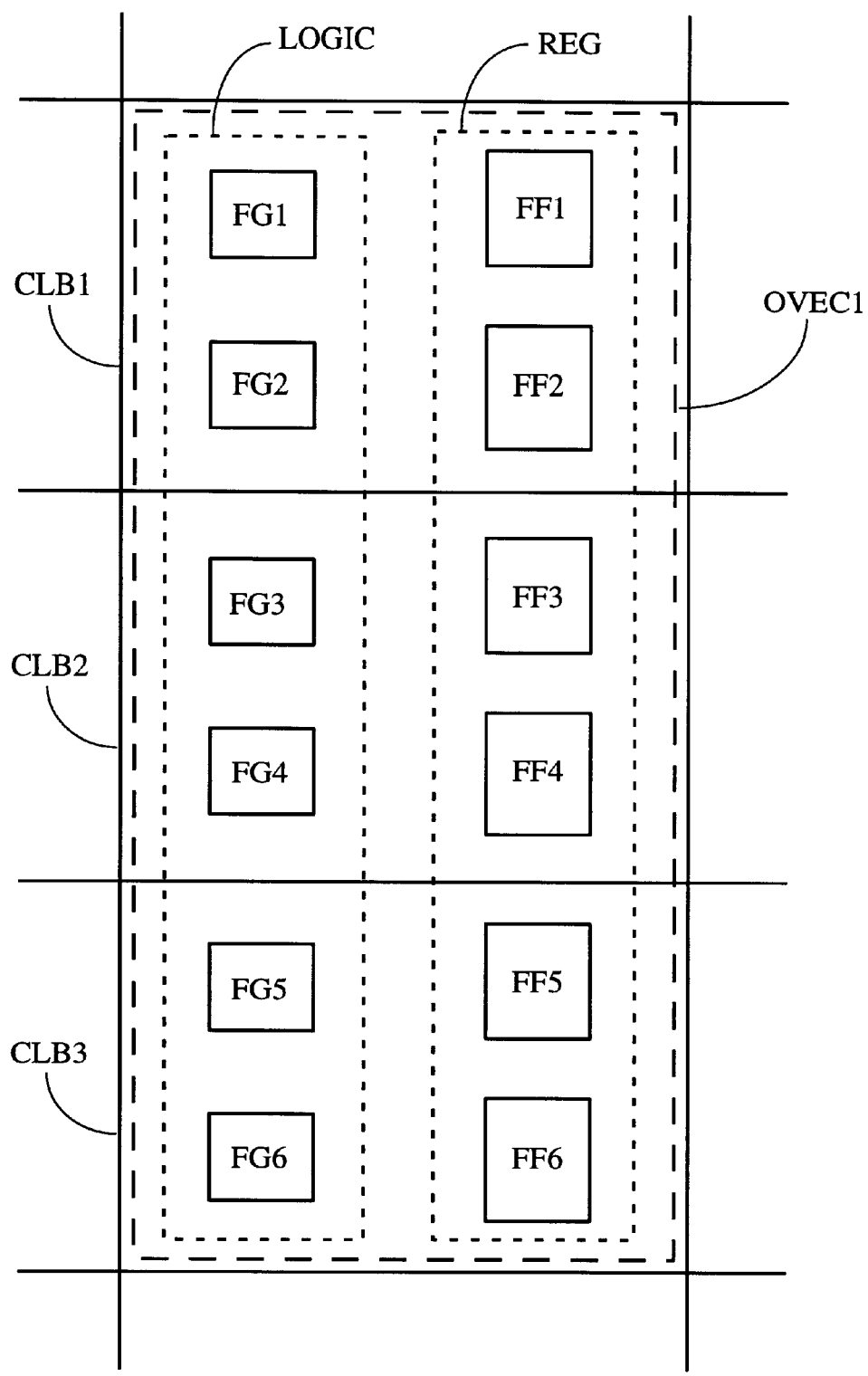
FIG. 3 shows a first row vector OVEC1 including two overlapped column vectors LOGIC and REG.

To "overlap" two vectors means that the two vectors are assigned to the same row or column of tiles (e.g., CLBs). The vector elements are, in effect, stacked in the z-dimension rather than the x or y dimension as for standard vectors. For example, an overlap vector for the Xilinx XC4000 Series architecture could contain zero, one, or two vectors of 4-input function generators, and zero, one, or two vectors of flip-flops. An overlap vector attempts to overlap its elements; if the elements cannot be overlapped, an error message is issued. In one Java embodiment, a row vector is created and designated as an overlap vector as follows:

OverlapTemplate vectorNameLayout=
  vectorName.applyoverlapTemplate(ROW);

FIG. 3 shows a first row vector OVEC1 including two overlapped column vectors LOGIC and REG. Vector LOGIC is mapped into function generators FG1–FG6 of CLBs CLB1–CLB3. Vector REG is a register and is mapped into flip-flops FF1–FF6 of CLBs CLB1–CLB3.

Figure 4:
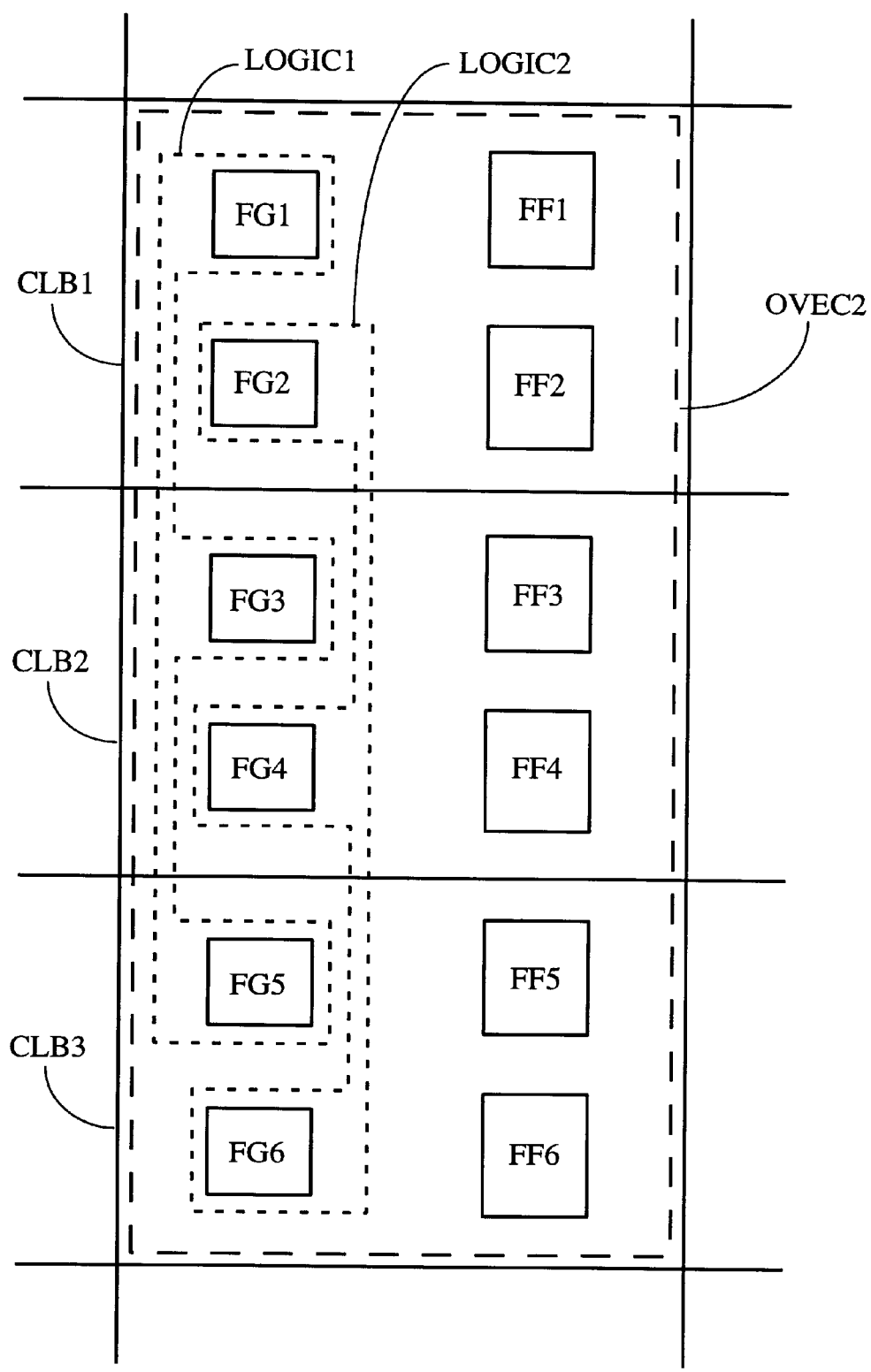
FIG. 4 shows a second row vector OVEC2 including two overlapped column vectors LOGIC1 and LOGIC2.

FIG. 4 shows a second row vector OVEC2 including two overlapped column vectors LOGIC1 and LOGIC2. In this example, both sub-vectors LOGIC1 and LOGIC2 use function generator logic, but sub-vector LOGIC1 includes a specification mapping the logic into the "top" function generator in each CLB, while sub-vector LOGIC2 includes a specification mapping the logic into the "bottom" function generator in each CLB. Note that vector OVEC2 could also be overlapped, in another module higher in the hierarchy, with a flip-flop-only module such as column vector REG of FIG. 3.

Figure 5:
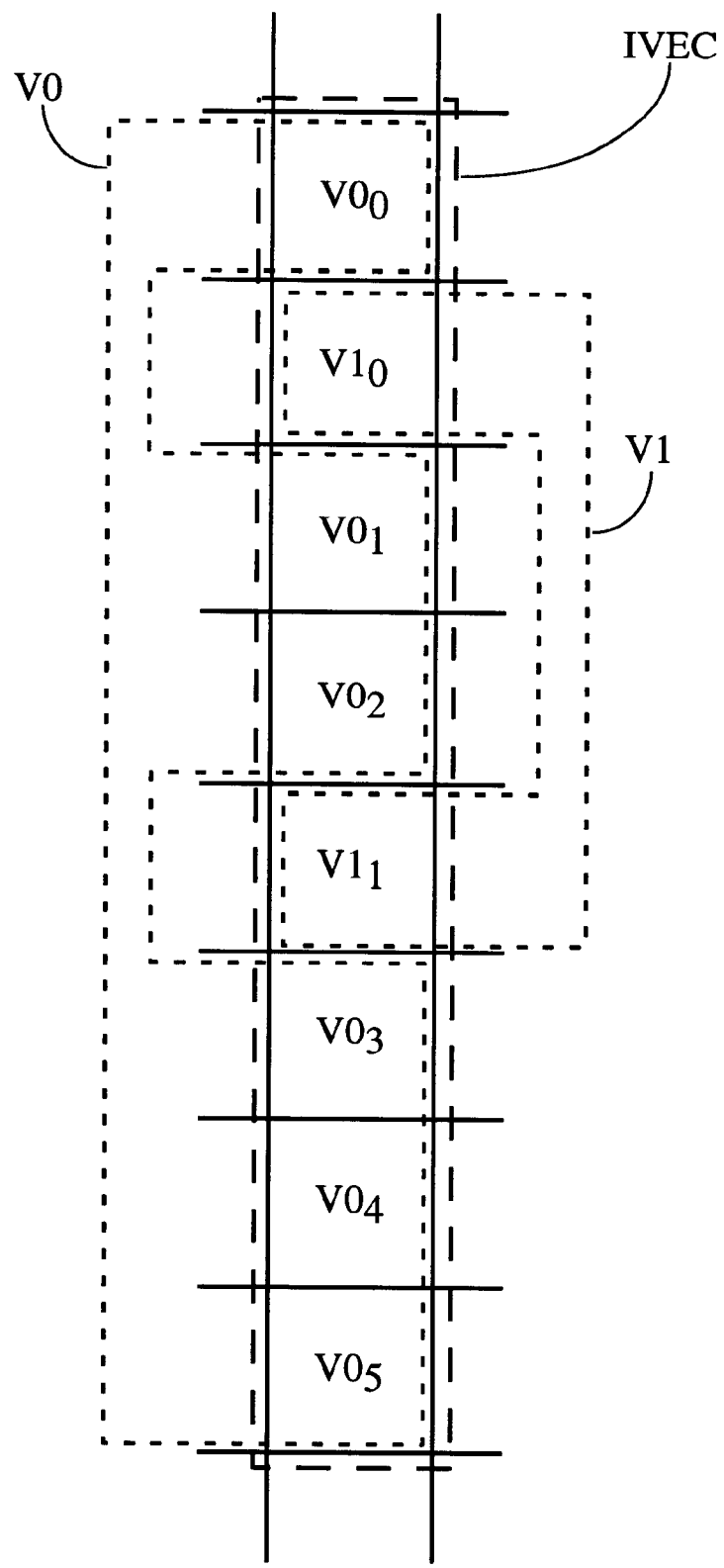
FIG. 5 shows a column vector IVEC interleaving two column vectors V0 and V1.

To "interleave" two vectors means that the two vectors are "shuffled together", i.e., their elements are assigned to the same row or column of CLBs, but are interspersed with one another. Each vector element is a sub-vector Vi. The sub-vector elements are shuffled together in the order specified by a "pattern" table of indices that is used cyclically. For example, a pattern of [0,1,1,2] indicates taking the first element from sub-vector V0, the next two from sub-vector V1, the next from sub-vector V2, the next from sub-vector V0, and so on. Any sub-vector that is exhausted (i.e., has "run out" of elements) is skipped, and the process repeats until all sub-vector elements are used. An interleave vector attempts to interleave its sub-vectors according to a specified pattern; if the sub-vectors cannot be interleaved as specified, an error message is issued. In one Java embodiment, a vector is created and designated as an interleave vector as follows:

InterleaveTemplate vectorNameLayout=
  vectorName.applyInterleaveTemplate(COLUMN);
vectorNameLayout.pattern("0 1 1 2");

FIG. 5 shows a column vector IVEC that interleaves two column vectors V0 and V1 using a pattern of [0,1,0]. In this example, vector V0 includes six elements $V0_0$–$V0_5$ and vector V1 includes two elements $V1_0$, $V1_1$. The first element $V0_0$ (the top element, as in this example vectors V0 and V1 have associated "top" attributes) comes from vector V0. As designated by the pattern, the second element $V1_0$ is from vector V1 and the third element $V0_1$ from vector V0. The pattern now repeats, and the fourth element $V0_2$ is from vector V0, the fifth element $V1_1$ from vector V1, and the sixth element $V0_3$ from vector V0. In the third iteration of the pattern, vector V1 has been exhausted, so the remaining elements of vector V0 are used to complete vector IVEC by adding elements $V0_4$, $V0_5$.

Note that while this and some other examples herein use single CLBs as vector elements to simplify the drawings, the vector elements may comprise lower-level elements such as function generators and/or flip-flops, or higher-level elements such as other row or column vectors, or a combination of any of these types of elements. For example, row elements can be combined to create either a column element or another row element. Row elements and column elements can be combined to create either a column element or a row element. In fact, a vector's orientation can be changed from row to column or vice versa. Any other vector attribute can also be changed, if desired.

Overlapping and interleaving vectors enable CLB-level packing when there is no contention for CLB resources between vector elements. However, to achieve high performance in a design that uses hierarchical modules, it is sometimes desirable to combine vector elements from two or more different vectors to utilize a single resource such as a function generator on a target device. Because a 4-input function generator can implement any logic function of four inputs and one output, such technology-specific remapping can be performed at the function generator level.

A "remapped" vector extends this operation from the function generator level to combine combinational elements in two or more different vectors while maintaining the vector indexing. By preserving this vector indexing, a "remapped" vector can be incorporated into another vector just like any other vector.

The method of the invention is particularly applicable to datapaths. A good datapath design methodology should minimize the amount of work required to accomplish any of the following tasks:
1) changing bit width;
2) changing bit order;
3) changing dataflow direction;
4) adding or removing either combinational or registered logic at any stage in the datapath; and
5) replacing a datapath component with another implementation having a different area/speed tradeoff.

For example, a register file in a datapath can be implemented with either flip-flops or RAM, and can be structured as a row of columns, a column of rows, a row of rows, or a column of columns. Vector attributes have a direct correspondence with register file structural parameters such as the number and width of the registers, and with register file layout properties such as data bus ordering and orientation.

Figure 6:
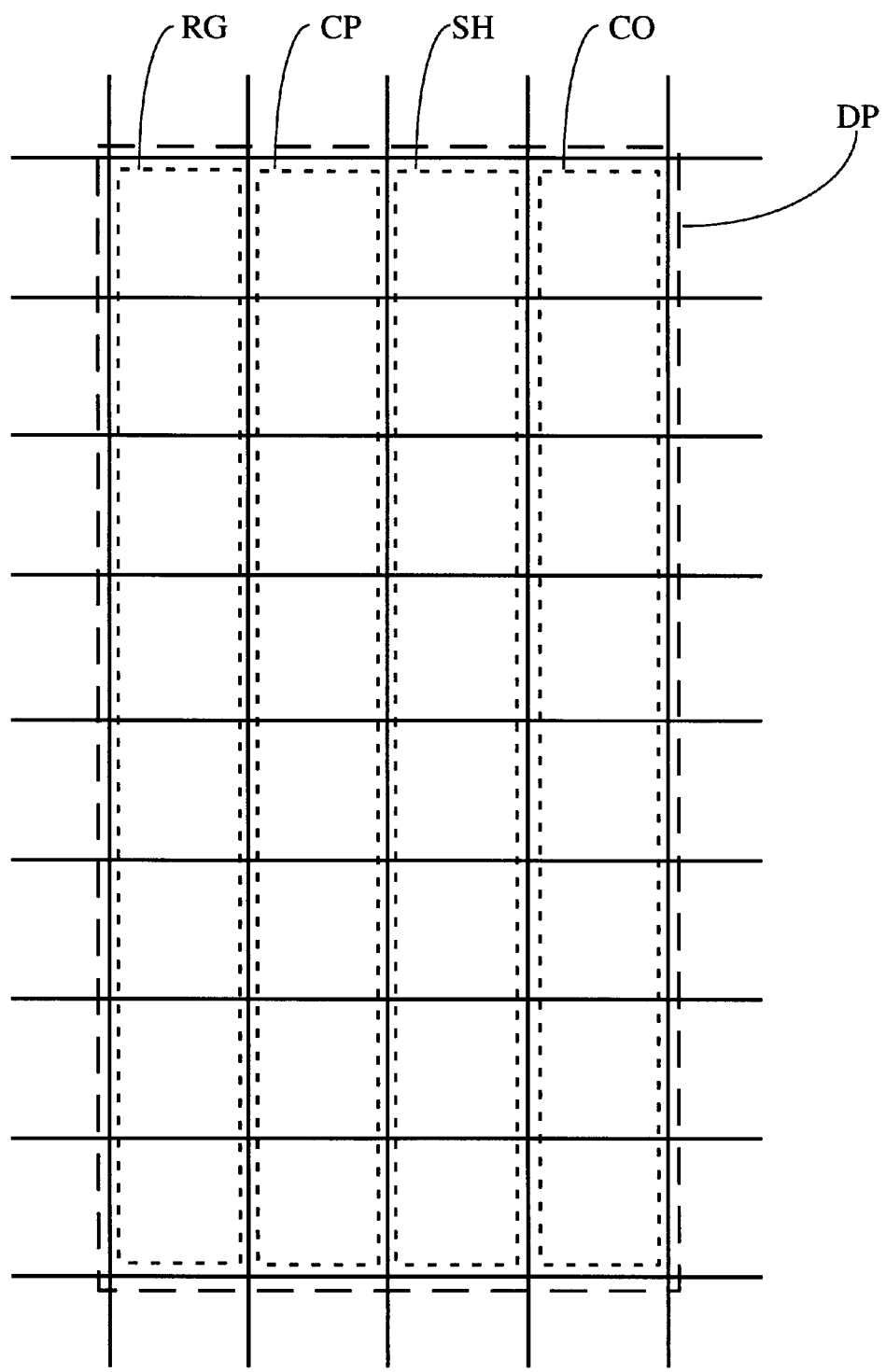
FIG. 6 shows a datapath implemented as a row vector comprising four column vectors.

The exemplary datapath of FIG. 6 comprises n registers followed by n complementers, n shifters, and n comparators. This datapath is captured succinctly as a vector layout with the first element RG comprising the register file, the second element CP comprising the complementers, the third element SH comprising the shifters, and the fourth element CO comprising the comparators. Each of these elements is implemented as a column vector of CLBs. These four elements are then combined in a row vector DP. To add an additional element to the datapath, such as a pipeline register, does not require any changes to the existing datapath elements, but merely the addition of the pipeline register to row vector VP. CLB utilization can optionally be improved by using overlap or remap vectors for parts of the datapath.

One type of logic module optionally using the placement specification method of the invention is described by Hwang et al in commonly assigned, concurrently filed U.S. patent application Ser. No. 09/049,892 entitled "Heterogeneous Method for Determining Module Placement in FPGAs", which is referenced above and incorporated herein by reference. The logic modules described by Hwang are written in Java.

Figure 7:
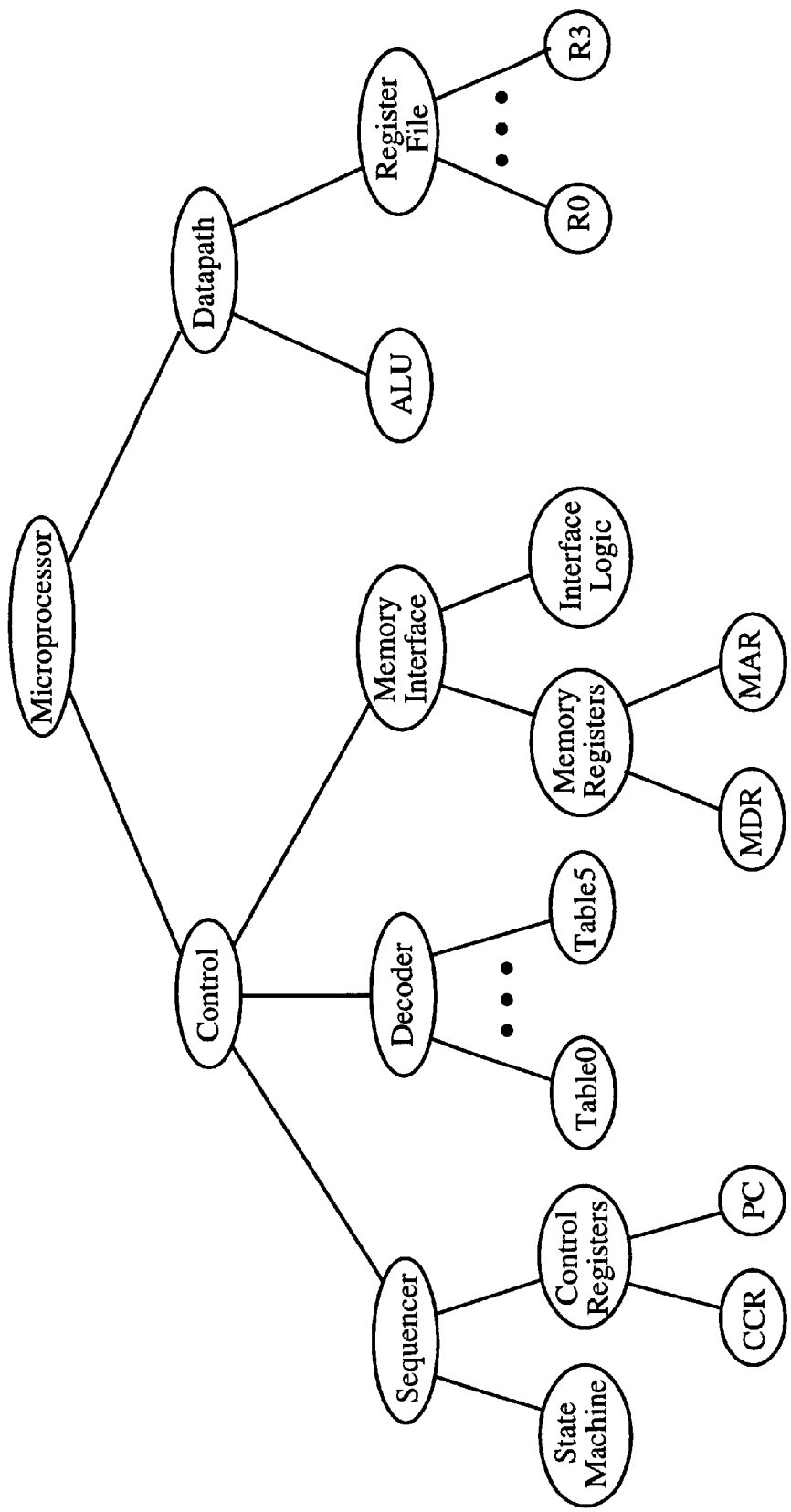
FIG. 7 shows a modular "tree" diagram for a microprocessor design.

FIG. 7 shows an exemplary modular "tree" diagram showing the physical hierarchical structure of a microprocessor design to be implemented in a programmable IC. A Java description for the microprocessor design of FIG. 7 is as follows:

```
// Set parameters
final int NUMBER_DECODE_TABLES=6;
final int NUMBER_GENERAL_REGISTERS=4;
// Define top-level module
SimGroup microprocessor=new SimGroup();
// Define and add second level of hierarchy
SimGroup control=new SimGroup();
SimGroup datapath=new SimGroup();
microprocessor.add(control);
microprocessor.add(datapath);
// Define and add third level of hierarchy in
// control module
SimGroup sequencer=new SimGroup();
SimGroup decoder=new SimGroup();
SimGroup memoryinterface=new SimGroup();
control.add(sequencer);
control.add(decoder);
control.add(memoryInterface);
// Define and add third level of hierarchy in
// datapath module
SimGroup alu=new SimGroup();
SimGroup registerFile=new SimGroup();
datapath.add(alu);
datapath.add(registerFile);
// Define and add fourth level of hierarchy in
// sequencer module
SimGroup controlRegisters=new SimGroup();
SimGroup stateMachine=new SimGroup();
sequencer.add(controlRegisters);
sequencer.add(stateMachine);
// Define and add fifth level of hierarchy in
// controlRegisters module
SimGroup ccr=new SimGroup();
SimGroup pc=new SimGroup();
controlRegisters.add(ccr);
controlRegisters.add(pc);
// Define and add fourth level of hierarchy in
// decoder module
for (int i=0; i <NUMBER_DECODE_TABLES; i++) {
    SimGroup decodeTable=new SimGroup();
    decoder.add(decodeTable);
}
// Define and add fourth level of hierarchy in
// memoryinterface module
SimGroup memoryRegisters=new SimGroup();
SimGroup interfaceLogic=new SimGroup();
memoryInterface.add(memoryRegisters);
memoryInterface.add(interfaceLogic);
// Define and add fifth level of hierarchy in
// memoryRegisters module
SimGroup mdr=new SimGroup();
SimGroup mar=new SimGroup();
memoryRegisters.add(mdr);
memoryRegisters.add(mar);
// Define and add fourth level of hierarchy in
// registerFile module
for (int i=0; i <NUMBER_GENERAL_REGISTERS;
    i++) {
    SimGroup register=new SimGroup();
    registerFile.add(register);
}
```

In the exemplary Java code above, a module is a Java object of class SimGroupo. Each time a new module is defined, the code "new SimGroupo" is used. The new module is then added to the parent module (the module "above" the new module in the hierarchy shown in FIG. 7).

For example, the "control" and "datapath" modules are defined using the code:
  SimGroup control=new SimGroup();
  SimGroup datapath=new SimGroup();
then added to the "microprocessor" module as follows.
  microprocessor.add(control);
  microprocessor.add(datapath);

The "decoder" module includes a set of tables, where the number of tables in the module is a parameter "NUMBER_DECODE_TABLES". (In the embodiment of FIG. 7, the parameter NUMBER_DECODE_TABLES is set to 6.) A "for" loop is used to implement this set of tables. Similarly, the "register file" module includes a variable number of registers (NUMBER_GENERAL_REGISTERS).

Figure 8:
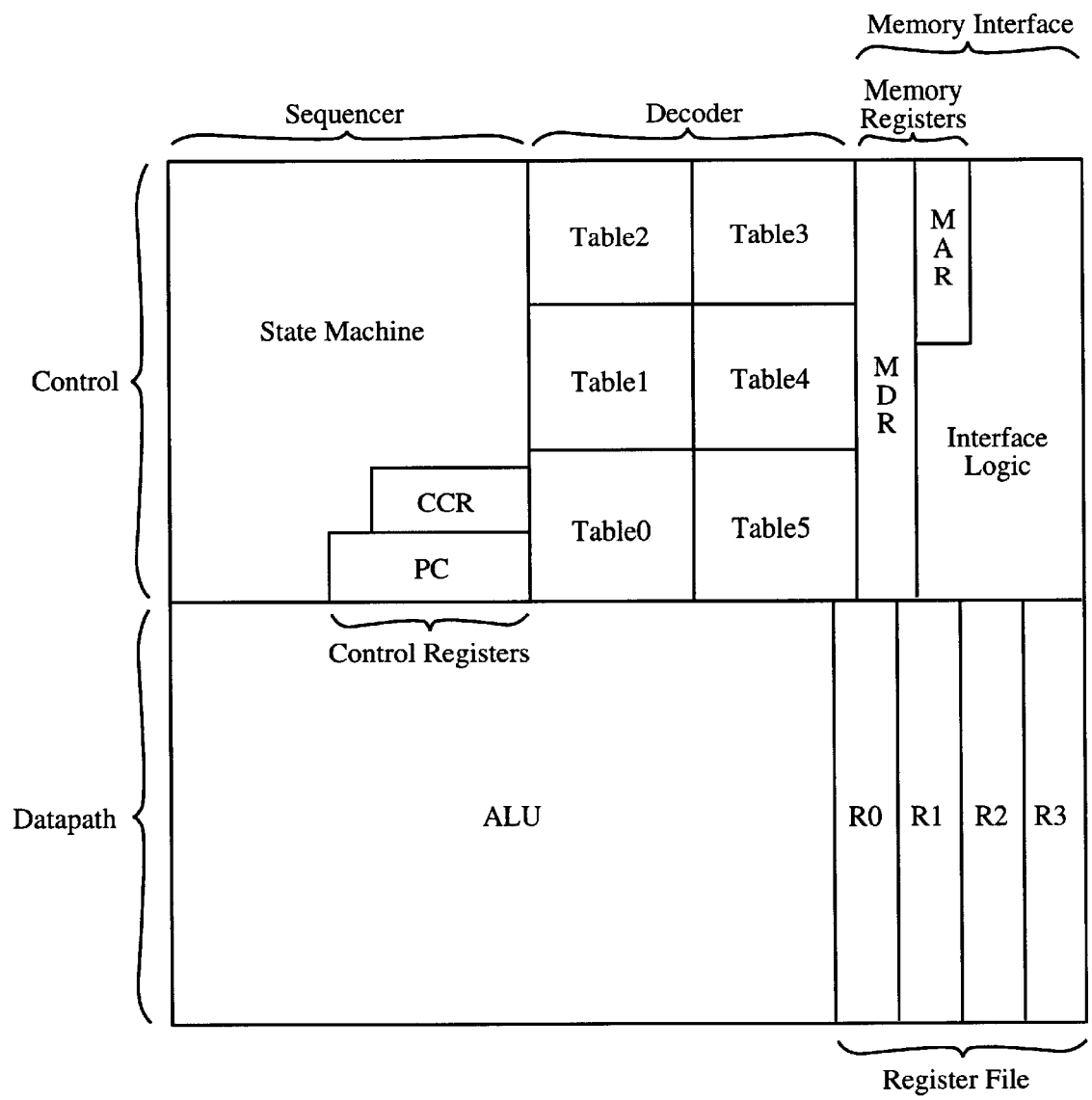
FIG. 8 shows the microprocessor design of FIG. 7 mapped into an FPGA.

FIG. 8 shows the microprocessor design of FIG. 7 mapped into an FPGA, including the relative positions of each module shown in FIG. 7 and in the above Java code. The Java placement directives for the microprocessor, defining a vector for each module using the placement specification method of the present invention and describing the layout of FIG. 8, are as follows.

```
// The microprocessor module is implemented as a
// column vector starting at the top
VectorTemplate microprocessorLayout=
   microprocessor.applyVectorTemplate(COLUMN);
microprocessorLayout.colDirection(FROM_TOP);
// The control module is implemented as a row vector
// starting at the left
VectorTemplate controlLayout=
   control.applyVectorTemplate(ROW);
controlLayout.rowDirection(FROM_LEFT);
// The datapath module is implemented as a row
// vector starting at the left
VectorTemplate datapathLayout=
   datapath.applyVectorTemplate(ROW);
datapathLayout.rowDirection(FROM_LEFT);
// The sequencer module is implemented as an overlap
// column vector starting at the bottom
OverlapTemplate sequencerLayout=
   sequencer.applyoverlapTemplate(COLUMN);
sequencerLayout.colDirection(FROM_BOTTOM);
// The stateMachine module is implemented using a
// simulated annealing algorithm
FlexibleLayout stateMachineLayout=
   stateMachine.applyFlexibleLayout();
// Constraints reserve space in the stateMachineLayout
// for the controlRegisters
// The controlRegisters module is implemented as a
// column vector starting at the top, with the
// elements aligned along their right edges
VectorTemplate controlRegistersLayout=
   controlRegisters.applyVectorTemplate(COLUMN);
controlRegistersLayout.colDirection(FROM_TOP);
controlRegistersLayout.alignAllElements(RIGHT);
// The decoder module is implemented as a column
// vector starting at the bottom, folded to the
// right after three elements
VectorTemplate decoderLayout=
   decoder.applyVectorTemplate(COLUMN);
decoderLayout.colDirection(FROM_BOTTOM);
decoderLayout.colFold(RIGHT);
decoderLayout.foldSize(NUMBER_DECODE_TABLES/2);
// The memoryinterface module is implemented as a
// row vector starting at the left
OverlapTemplate memoryInterfaceLayout=
   memoryInterface.applyoverlapTemplate(ROW);
memoryInterfaceLayout.rowDirection(FROM_LEFT);
// The memoryRegisters module is implemented as a
// row vector starting at the left, with the
// elements aligned along their top edges
VectorTemplate memoryRegistersLayout=
   memoryRegisters.applyVectorTemplate(ROW);
memoryRegistersLayout.rowDirection(FROM_LEFT);
memoryRegistersLayout.alignAllElements(TOP);
// The interfaceLogic module is implemented using
// a simulated annealing algorithm
FlexibleLayout interfaceLogicLayout=
   interfaceLogic.applyFlexibleLayout();
// Constraints reserve space in the interfaceLogicLayout
// for the memoryRegisters
// The alu module is implemented as an RPM
RelationallyPlacedMacro aluLayout=alu.applyRPM();
// The registerFile module is implemented as a row
// vector starting at the left
VectorTemplate registerFileLayout=
   registerFile.applyVectorTemplate(ROW);
registerFileLayout.rowDirection(FROM_LEFT);
```

As can be seen from the above placement directives, the physical information is organized in a manner corresponding to the modular tree of FIG. 7. The "microprocessor" module is laid out as a column vector with two sub-vectors, "control" and "datapath". The "microprocessor" vector also has an assigned direction attribute "FROM_TOP", which specifies that the column be built with the sub-vector first added to the vector (in this case, "control") at the top, as in FIG. 8. The "control" and "datapath" modules are both laid out as row vectors (orientation attribute "ROW"), and are laid out from the left (direction attribute "FROM_LEFT"). The "sequencer" module is laid out as an overlap vector, where the "CCR" and "PC" vectors are overlapped with the "state machine" layout.

The "state machine" and "logic" modules use a different type of layout strategy. To implement these modules, a Java method called "applyFlexibleLayout()" is used. In this example, the applyFlexibleLayout() method implements a simulated annealing algorithm, but other layout strategies could also be used. This procedure of incorporating different layout strategies in a single design is described by Hwang et al in the above-referenced U.S. patent application Ser. No. 09/049,892 entitled "Heterogeneous Method for Determining Module Placement in FPGAs".

The "decoder" module includes six different tables, Table 0–Table 5, as shown in FIG. 7. To advantageously fit the decoder into the control module, the decoder column vector is folded into a "double column" as follows:
  decoderLayout.foldSize(NUMBER_DECODE_TABLES/2);
As shown in FIG. 8, tables Table 0–Table 2 form a first column next to tables Table 3–Table 5.

The "alu" module is incorporated as a Relationally Placed Macro (RPM) previously implemented using prior art methods. A Java method called "applyRPM()" is used to incorporate an RPM into a vector-based design.

It has been demonstrated that the method of the invention provides a coordinate-free method of specifying relative placements for module elements, providing the advantages of portability across different FPGA architectures and ease of creating and modifying module placements. Those having skill in the relevant arts of the invention will now perceive various modifications and additions which may be made as a result of the disclosure herein. For example, the above text describes the invention in the context of SRAM-based FPGAs. However, the invention can also be applied to other programmable ICs such as mask-programmable FPGAs, Application Specific ICs (ASICs), and devices in which only a portion of the logic is programmable. Accordingly, all such modifications and additions are deemed to be within the scope of the invention, which is to be limited only by the appended claims and their equivalents.

What is claimed is:

1. A method for specifying placement information for elements in a programmable IC, the method comprising the steps of:

specifying a first element to be included in the programmable IC;

specifying a second element to be included in the programmable IC; and specifying a structural organization for the first and second elements, the structural organization being specified without the use of numerical coordinates, wherein:
   the first element comprises a first column vector;
   the second element comprises a second column vector; and
   the structural organization comprises a third column vector of the first and second column vectors.

2. The method of claim 1, wherein the first and second column vectors are interleaved to form the third column vector.

3. A method for specifying placement information for elements in a programmable IC, the method comprising the steps of:

specifying a first element to be included in the programmable IC;

specifying a second element to be included in the programmable IC; and specifying a structural organization for the first and second elements, the structural organization being specified without the use of numerical coordinates, wherein:
   the first element comprises a first row vector;
   the second element comprises a second row vector; and
   the structural organization comprises a third row vector of the first and second row vectors.

4. The method of claim 3, wherein the first and second row vectors are interleaved to form the third row vector.

5. A method for determining the placement of elements in a logic module, the method comprising the steps of:

specifying a first vector element;
   assigning a first orientation to the first vector element;
   specifying a second vector element;
   assigning a second orientation to the second vector element; and
   specifying a relative placement for the second vector element relative to the first vector element, the first and second vector elements forming a third vector element.

6. The method of claim 5, further comprising the step of specifying a direction for the first vector element.

7. The method of claim 5, further comprising the step of specifying an alignment for the first vector element.

8. The method of claim 5, wherein the first and second vector elements are abutting.

9. The method of claim 5, wherein the logic module is targeted to an FPGA comprising an array of CLBs, further comprising the step of specifying that the first and second vector elements be separated by a specified number of CLBs.

10. The method of claim 5, wherein the logic module is targeted to an FPGA comprising an array of CLBs, further comprising the step of specifying that at least a portion of the first and second vector elements be mapped into the same CLBs.

11. The method of claim 5, wherein the logic module is a datapath.

12. A method for determining the placement of elements in a logic module, the method comprising the steps of:

specifying a first vector element;
   assigning a first orientation to the first vector element;
   specifying a second vector element;
   assigning a second orientation to the second vector element, the second orientation being the same as the first orientation; and
   specifying a relative placement for the second vector element relative to the first vector element, the first and second vector elements forming a third vector element having an orientation the same as the orientation of the first and second vector elements.

13. The method of claim 12, further comprising the step of specifying that the first and second vector elements be interleaved to form the third vector element.

14. The method of claim 12, further comprising the step of specifying that the first and second vector elements be overlapped to form the third vector element.

15. A method for determining the placement of elements in a logic module, the method comprising the steps of:

specifying a first vector element;
   assigning a first orientation to the first vector element;
   specifying a second vector element;
   assigning a second orientation to the second vector element, the second orientation being the same as the first orientation; and
   specifying a relative placement for the second vector element relative to the first vector element, the first and second vector elements forming a third vector element having an orientation perpendicular to the orientation of the first and second vector elements.

16. The method of claim 15, further comprising the step of specifying a direction for the first vector element.

17. The method of claim 15, further comprising the step of specifying an alignment for the first vector element.

18. The method of claim 15, wherein the first and second vector elements are abutting.

19. The method of claim 15, wherein the logic module is targeted to an FPGA comprising an array of CLBS, further comprising the step of specifying that the first and second vector elements be separated by a specified number of CLBs.

20. The method of claim 15, wherein the logic module is targeted to an FPGA comprising an array of CLBS, further comprising the step of specifying that at least a portion of the first and second vector elements be mapped into the same CLBs.

21. The method of claim 15, wherein the logic module is a datapath.

22. A method for specifying placement information for elements in a programmable IC, the method comprising the steps of:

specifying a first element to be included in the programmable IC;

specifying a second element to be included in the programmable IC; and specifying a structural organization for the first and second elements, including specifying a vector orientation for a combination of the first and second elements.

23. The method of claim 22, wherein:

the first element comprises a first column vector;

the second element comprises a second column vector; and the structural organization comprises a row vector of the first and second column vectors.

24. The method of claim 22, wherein:

the first element comprises a first row vector;

the second element comprises a second row vector; and the structural organization comprises a column vector of the first and second row vectors.

25. The method of claim 22, wherein specifying the structural organization further includes specifying a direction for at least one of the first and second elements.

26. The method of claim 22, wherein specifying the structural organization further includes specifying an alignment for the first and second elements.

27. The method of claim 22, wherein specifying the structural organization further includes specifying a spacing between the first and second elements.

28. The method of claim 22, wherein specifying the structural organization further includes specifying an offset between the first and second elements.

29. The method of claim 22, wherein specifying the structural organization further includes specifying that at least one of the first and second elements be folded to fit an available space.

30. The method of claim 22, wherein specifying the structural organization further includes specifying that the first and second elements be overlapped.

31. The method of claim 22, wherein the programmable IC is an FPGA comprising an array of CLBs, and specifying the structural organization further includes specifying that the first and second elements be combined and remapped into the CLBs.

32. The method of claim 22, wherein:

the first element comprises a first column vector;

the second element comprises a second column vector; and the structural organization comprises a third column vector of the first and second column vectors.

33. The method of claim 22, wherein specifying the structural organization further includes specifying that the first and second elements be interleaved to form the third column vector.

34. The method of claim 22, wherein:

the first element comprises a first row vector;

the second element comprises a second row vector; and the structural organization comprises a third row vector of the first and second row vectors.

35. The method of claim 34, wherein specifying the structural organization further includes specifying that the first and second elements be interleaved to form the third row vector.

* * * * *